United States Patent
Wang et al.

(10) Patent No.: US 12,419,082 B2
(45) Date of Patent: Sep. 16, 2025

(54) FIELD EFFECT TRANSISTOR DEVICE

(71) Applicant: Soochow University, Suzhou (CN)

(72) Inventors: Mingxiang Wang, Suzhou (CN); Lekai Chen, Suzhou (CN); Dongli Zhang, Suzhou (CN); Huaisheng Wang, Suzhou (CN)

(73) Assignee: Soochow University, Suzhou (CN)

( * ) Notice: Subject to any disclaimer, the term of this patent is extended or adjusted under 35 U.S.C. 154(b) by 0 days.

(21) Appl. No.: 17/997,556

(22) PCT Filed: Dec. 1, 2021

(86) PCT No.: PCT/CN2021/134781
§ 371 (c)(1),
(2) Date: Oct. 31, 2022

(87) PCT Pub. No.: WO2023/029258
PCT Pub. Date: Mar. 9, 2023

(65) Prior Publication Data
US 2024/0304729 A1    Sep. 12, 2024

(30) Foreign Application Priority Data

Sep. 6, 2021   (CN) .......................... 202111039996.3

(51) Int. Cl.
*H10D 30/67* (2025.01)
*H10D 30/43* (2025.01)
(Continued)

(52) U.S. Cl.
CPC ......... *H10D 30/6757* (2025.01); *H10D 30/43* (2025.01); *H10D 30/475* (2025.01);
(Continued)

(58) Field of Classification Search
CPC .. H10D 30/6757; H10D 30/43; H10D 30/475; H10D 30/6729; H10D 30/6735;
(Continued)

(56) References Cited

U.S. PATENT DOCUMENTS 9,117,893 B1 *   8/2015  Hu ....................... H10D 62/822
2016/0268401 A1 * 9/2016  Aleksov ............... H10D 64/518
2017/0323916 A1 * 11/2017 Bakhishev ........... H10D 62/314

FOREIGN PATENT DOCUMENTS

EP      2148374 A1 *   1/2010   ............. B82Y 10/00

* cited by examiner

*Primary Examiner* — Jeff W Natalini
*Assistant Examiner* — Nicholas Leland Hutson
(74) *Attorney, Agent, or Firm* — Wang Law Firm, Inc.

(57) ABSTRACT

The present invention discloses a field effect transistor device for improving the problem of the short-channel effect of a field effect transistor in the prior art, comprising: an active layer, comprising a source region, a drain region, and a channel region located between the source region and the drain region; a gate provided around the channel region; and a gate insulating layer provided between the gate and the channel region; wherein when a device is turned on, an effective channel, and an equivalent source and/or equivalent drain away from the effective channel are formed in the channel region, and the field effect transistor device connects the source region and the drain region through the effective channel, and the equivalent source and/or equivalent drain to contribute an operating current.

13 Claims, 10 Drawing Sheets (51) Int. Cl.
  *H10D 30/47* (2025.01)
  *H10D 62/10* (2025.01)
(52) U.S. Cl.
  CPC ..... *H10D 30/6729* (2025.01); *H10D 30/6735* (2025.01); *H10D 62/121* (2025.01)
(58) Field of Classification Search
  CPC ...... H10D 62/121; H10D 30/60; H10D 30/67; H10D 62/10; H10D 62/17; H10D 62/8503; H10D 64/27
  See application file for complete search history.

FIELD EFFECT TRANSISTOR DEVICE

CROSS-REFERENCE TO RELATED APPLICATIONS

The present invention claims priority to the Chinese patent application No. 202111039996.3 entitled "Field Effect Transistor Device" filed on Sep. 6, 2021, to the China National Intellectual Property Administration, the entire contents of which are incorporated herein by reference.

TECHNICAL FIELD

The present invention specifically relates to a field effect transistor (FET) device, falling within the technical field of semiconductor devices.

BACKGROUND ART

With the development of the integrated circuit technology, the gate length (corresponding to the channel length) of a field effect transistor is shrinking, and the integrated circuits based on sub-micron or about 10 nanometers gate length devices have been mass-produced. For devices of such small sizes, how to cope with their short-channel effects is an important challenge in device technology. The short channel effect makes the threshold voltage and the subthreshold characteristics of devices with small sizes deteriorate. Specifically, the threshold voltage of a device is no longer a constant, but decreases with the decrease of the channel length and decreases with the increase of device drain voltage; the subthreshold swing in device transfer characteristic also degrades simultaneously.

Currently, a method to improve the short-channel effect of a field effect transistor device is the surrounding gate transistor (Gate-All-Around FET, GAAFET), which enhances the control of the gate over the channel by providing a surrounding gate to wrap the channel region. But there is still room for improvement in the short-channel effect of a transistor of this form.

SUMMARY OF THE INVENTION

The main object of the present invention is to provide a field effect transistor device for improving the problem of the short-channel effect of a device.

To achieve the above object, the present invention provides a field effect transistor device which comprises an active layer including a source region, a drain region, and a channel region located between the source region and the drain region; a gate provided around the channel region; and a gate insulating layer provided between the gate and the channel region. When a device is turned on, an effective channel and an equivalent source and/or equivalent drain away from the effective channel are formed in the channel region, and the field effect transistor device connects the source region and the drain region through the effective channel, and the equivalent source and/or equivalent drain to contribute an operating current.

In an embodiment, a conductive region that does not connect the source region and the drain region is formed in the channel region. When the conductive region is in connection with the source region, the conductive region constitutes the equivalent source. When the conductive region is in connection with the drain region, the conductive region constitutes the equivalent drain.

In an embodiment, the perpendicular projections of the gate and the conductive region on a reference plane overlap, the gate can control the channel region and form a channel therein, and portions of perpendicular projections of the gate and the conductive region on the reference plane that are not overlapping each other constitute the effective channel, wherein the reference plane is a plane passing through a central axis along a length direction of the channel region.

In an embodiment, when the device is turned on, the conductance of the conductive region is greater than that of the rest portion of the channel other than the effective channel so that at least one of the conductive region and the effective channel can inject carriers into the other.

Preferably, the conductance of the conductive region is at least greater than three times of the conductance of the rest portion of the channel other than the effective channel.

In an embodiment, the conductance per unit length of the effective channel in the channel is greater than the conductance per unit length of a rest portion of the channel other than the effective channel when the device is turned on.

Preferably, the conductance per unit length of the effective channel in the channel is at least greater than three times of the conductance per unit length of a rest portion of the channels other than the effective channel when the device is turned on.

In an embodiment, a thickness of a portion of the gate insulating layer corresponding to the effective channel is less than the thickness of the rest portion of the gate insulating layer; and/or a portion of the gate insulating layer corresponding to the effective channel and the rest portion of the gate insulating layer are made of materials with different dielectric constants; and/or a portion of the gate corresponding to the effective channel and the rest portion are made of materials having different work functions.

In an embodiment, the equivalent source and/or equivalent drain extend along a central axis of a length direction of the channel region.

In an embodiment, the active layer comprises at least two semiconductor materials that change along an axial direction or a radial direction of the active layer.

In an embodiment, the conductive region is formed by carriers introduced by doping in the channel region.

In an embodiment, the insulating structure is provided in the channel region, wherein the conductive region is formed by a layer of carriers induced in the channel region approximated to the insulating structure. The carriers are induced through electrostatic induction by electric charges introduced into the insulating structure.

In an embodiment, the semiconductor structure is provided in the channel region, the semiconductor structure and the channel region form a heterostructure, and the conductive region is composed of a two-dimensional electron gas channel or a two-dimensional hole gas channel formed in the heterostructure.

In an embodiment, the active layer is configured as a nanowire, nanosheet, or nanoring.

The advantages of the present invention over the prior art are at least as follows. when the device is set to be turned on, an effective channel, and an equivalent source and an equivalent drain away from the effective channel can be formed in the channel region so that the source region and the drain region are in connection to contribute an operating current. In this way, the equivalent drain (source) in connection with the drain (source) region is structurally away from the effective channel, so that the influence of the drain voltage on the effective channel can be reduced; the peak value electric field in the depletion region at the drain end when the device is operated in saturation is reduced, thereby suppressing the short-channel effect of the device and improving the output characteristics of the device.

DETAILED DESCRIPTION OF THE INVENTION

Exemplary embodiments that embody the features and advantages of the present invention are described in detail in the following description. It should be understood that the invention is capable of various modifications in various embodiments, all without departing from the scope of the invention, and that the description and drawings are to be regarded as illustrative in nature, rather than restrictive of the present invention.

Unless defined otherwise, all technical and scientific terms used in the specification have the same meaning as commonly understood by one of ordinary skill in the art to which the present invention belongs. The terms used in the description of the present invention are for the purpose of describing particular embodiments only and are not intended to limit the present invention.

Figure 1:
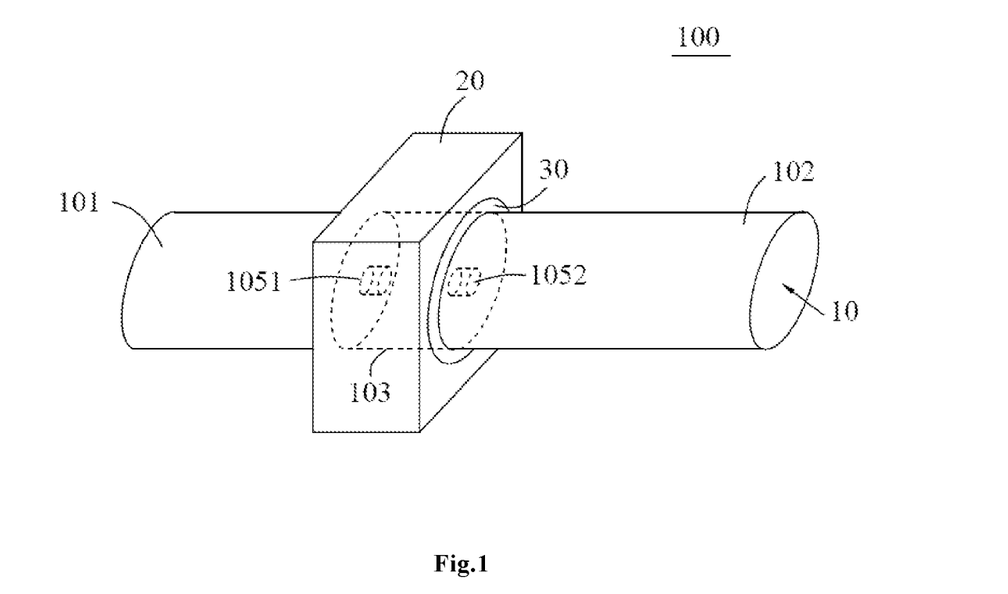
FIG. 1 is a schematic structural diagram of a field effect transistor device according to an embodiment of the present invention.
Figure 2:
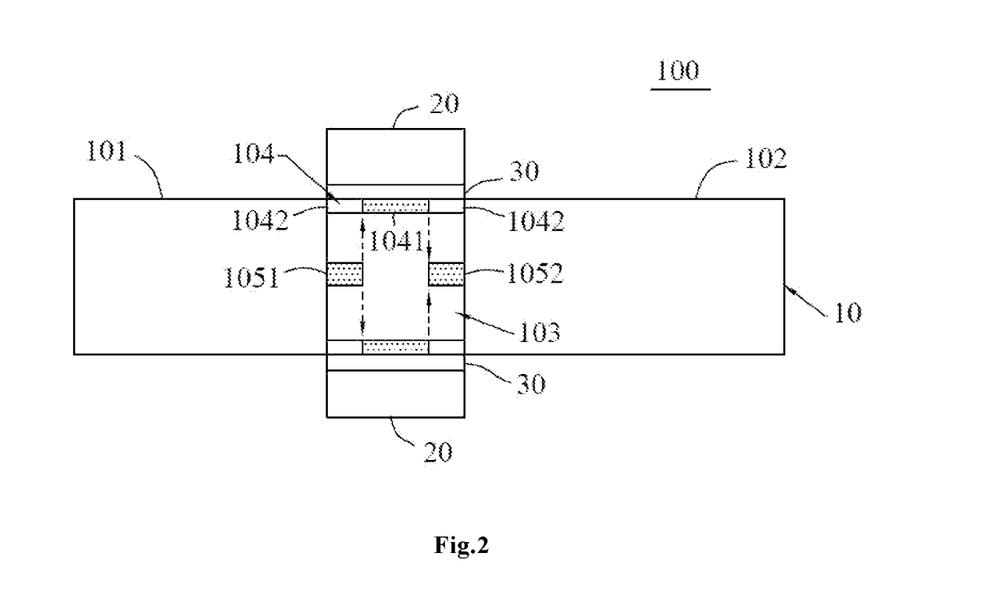
FIG. 2 is a cross-sectional view of a field effect transistor turned on according to an embodiment of the present invention.

Referring to FIGS. 1 and 2, a specific embodiment of a field effect transistor device 100 of the present invention is described. In the present embodiment, the field effect transistor device 100 includes an active layer 10, a gate 20, and a gate insulating layer 30.

The active layer 10 comprises a source region 101, a drain region 102, and a channel region 103 located between the source region 101 and the drain region 102. The gate 20 is provided around the channel region 103, and the gate insulating layer 30 is located between the gate 20 and the channel region 103. In this embodiment, the gate 20 entirely wraps the channel region 103, i.e., it is a fully surrounding gate 20.

In conjunction with the schematic view shown in FIG. 2 when the device is turned on, an effective channel 1041, and an equivalent source 1051 and an equivalent drain 1052 away from the effective channel 1041 are now formed in the channel region 103 of the field effect transistor device 100, and the field effect transistor device 100 connects the source region 101 and the drain region 102 via the effective channel 1041, the equivalent source 1051, and the equivalent drain 1052 to contribute an operating current. That is, the effective channel 1041, the equivalent source 1051, and the equivalent drain 1052 together form a passage contributing the operating current when the device is turned on.

In this embodiment, a length direction in which the channel region 103 extends between the source region 101 and the drain region 102 is referred to as an axial direction of the channel region 103, and a straight line extending direction in a plane perpendicular to the axial direction of the channel region 103 is referred to as a radial direction of the channel region 103. On this basis, the reference in the present invention to "away" between the effective channel 1041, and the equivalent source 1051 and the equivalent drain 1052 may mean having a spacing in the radial direction of the channel region 103, or having a spacing in both the radial direction of the channel region 103 and in the axial direction of the channel region 103.

In one typical field effect transistor device 100, the source region 101 in the active region 10 is used to provide carriers when the device is turned on, while the drain region 102 is used to collect carriers provided by the source region 101. Accordingly, in the present invention, an equivalent source 1051 refers to a structure in which carriers provided by the source region 101 can be directly injected into the effective channel 1041, and an equivalent drain 1052 refers to a structure in which carriers can be directly received from the effective channel 1041 and injected into the drain region 102.

With reference to FIG. 2, the "effective channel 1041" as referred to in this application refers to the channel that contributes to the main carrier passage when the device is turned on. Taking this embodiment as an example, when a gate bias is applied to the gate 20 to turn on the device, a position below the gate 20 can be controlled to form a channel 104, and the channel 104 is connected to the source region 101 and the drain region 102 correspondingly from a structural perspective. Specifically, if a plane passing through the central axis of the channel region 103 is defined as the reference plane, only the portion of the channel 104 that does not overlap with the perpendicular projections of the equivalent source 1051 and the equivalent drain 1052 on the reference plane will be referred to as the "effective channel 1041" herein.

The arrangement of the equivalent source 1051 and the equivalent drain 1052 is equivalent to shortening the length of a portion of the channel 104 which can conduct an operating current, namely, the effective channel 1041 is spaced apart from the source region 101 and the drain region 102. Besides, the equivalent drain 1052 in connection with the drain region 102 is structurally away from the effective channel 1041 to reduce the effect of the drain potential on the effective channel 1041, while the equivalent source 1051 in connection with the source region 101 is structurally away from the effective channel 1041 to likewise reduce the effect of the drain potential on the effective channel 1041 so as to improve the short-channel effect of the device.

In an embodiment of the present invention, the equivalent source 1051 and the equivalent drain 1052 may preferably both extend along a central axis along the length direction of the channel region 103. In this way, both the equivalent source 1051 and the equivalent drain 1052 can have a reasonable spacing from the surrounding gate 20 as a whole, thereby minimizing the effect of the source potential and the drain potential on the effective channel 1041.

Figure 3:
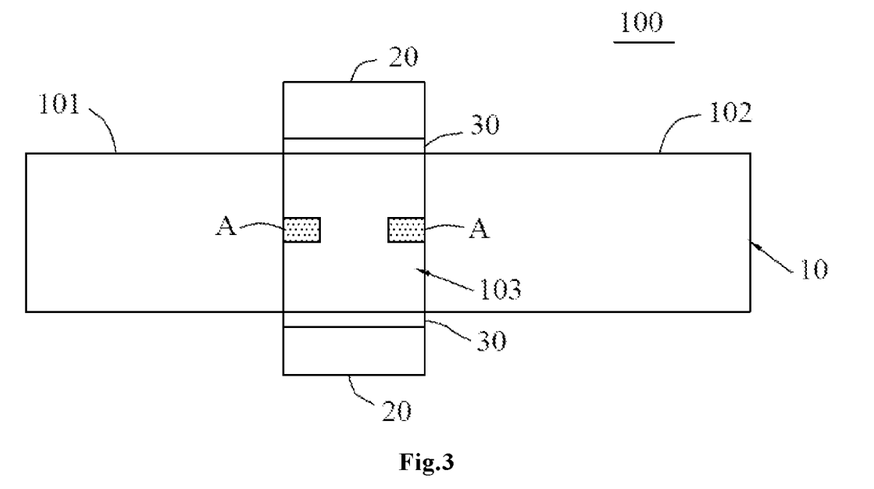
FIG. 3 is a schematic view of a field effect transistor forming a conductive region according to an embodiment of the present invention.

With reference to FIG. 3, in the specific preparation of the equivalent source 1051 and the equivalent drain 1052, a conductive region A which does not connect a source region 101 and a drain region 102 can be formed in a channel region 103 such that when the conductive region A connects with the source region 101, this portion of the conductive region A constitutes the equivalent source 1051; when the conductive region A connects with the drain region 102, this portion of the conductive region constitutes an equivalent drain 1052. In the present embodiment, the conductive region A is divided into two portions, one of which is in connection with the source region 101 and the other of which is in connection with the drain region 102, thereby simultaneously forming the equivalent source 1051 and the equivalent drain 1052 in the channel region 103.

When the device is turned on, the conductance of conductive region A is set to be greater than the conductance of the rest portion of the channel except the effective channel 1041 so that carriers can be injected into each other between conductive region A and effective channel 1041. In this way, carriers in the source region 101 can be attracted by the equivalent source 1051 with a greater conductance and will not be directly injected into the rest portion 1042 of the channel 104 which is directly connected to the source region 101. Similarly, carriers transported in the effective channel 1041 will also be attracted by the equivalent drain 1052 without being subsequently transported through the rest portion 1042 of the channel 104. As a carrier flow direction indicated by a dotted arrow in FIG. 2, in the contributed operating current of the device of the present embodiment, the carrier provided by the source region 101 enters the equivalent source 1051, and is injected into the effective channel 1041 from one end of the equivalent source 1051 away from the source region 101; carriers flowing through the effective channel 1041 will in turn be injected into the equivalent drain 1052 at one end adjacent to the equivalent drain 1052, and eventually into the drain region 102.

To achieve the carrier injection arrangement herein between the equivalent source 1051, the equivalent drain 1052, and the effective channel 1041, the conductance of the conductive region A may be arranged to be at least greater than three times of the conductance of the rest portion 1042 of the channel 104 other than the effective channel 1041. Besides, since carriers flow in the radial direction of the channel region 103 during the above-described "injection", the spacing of the conductive region A and the effective channel 1041 in the radial direction of the channel region 103 in this embodiment may be set to 1 nm~10 μm, or more preferably 3 nm~1 μm, or more preferably 5 nm~100 nm according to the specific design of different devices so as to ensure the effective injection of carriers and the performance of the devices.

It needs to be noted that the reference to "carrier" in this application refers to charges that are free to move in the corresponding conduction type channel/conductive region A. Generally, we refer to electrons in the N-type channel or holes in the P-type channel as the "carrier" herein, and correspondingly, the hole in the N-type channel or the electron in the P-type channel is not referred to as the "carrier" herein. Therefore, the polarities of the effective channel 1041 and the conductive region A are set to be the same in this application such that the carrier interaction between the effective channel 1041 and the conductive region A can contribute substantially to the operating current of the device.

Figure 4:
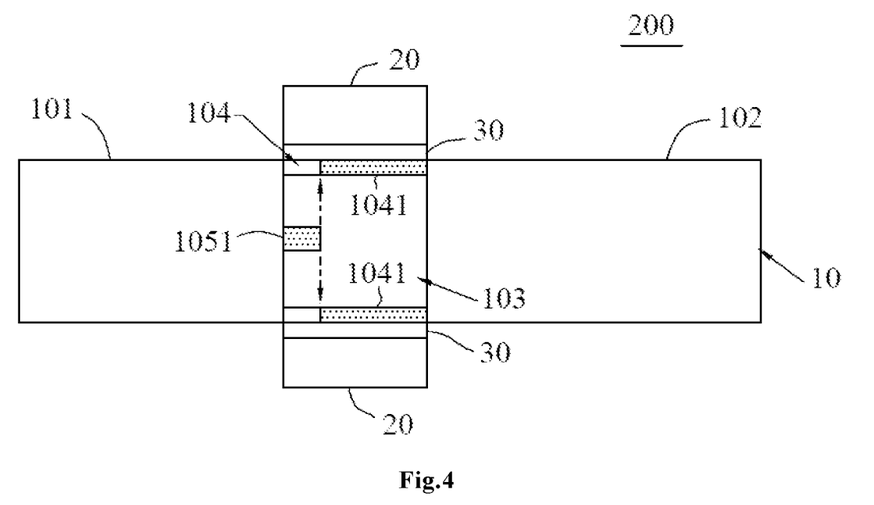
FIGS. 4 to 9 are schematic structural diagrams of a field effect transistor device according to various embodiments of the present invention.

Referring to FIG. 4, another embodiment of a field effect transistor device 200 of the present invention is described.

Unlike the embodiments described above, in this embodiment no equivalent drain is formed in the channel region 103 at this time when the device is turned on. The field effect transistor device 200 connects the source region 101 and the drain region 102 through the effective channel 1041 and the equivalent source 1051 to contribute an operating current.

In the present embodiment, it is equivalent to that the effect of the drain potential on the potential near the source end of the channel region 103 is reduced just by the provision of the equivalent source 1051, thereby improving the short-channel effect of the device. Correspondingly, the effective channel 1041 is directly connected to the drain region 102.

In carrier transmission, the carrier provided by the source region 101 can enter the equivalent source 1051, and is injected into the effective channel 1041 from one end of the equivalent source 1051 away from the source region 101; the carrier flowing through the effective channel 1041 is re-injected back to the drain region 102. That is, in this embodiment, only the conductive region injects carriers unidirectionally into the effective channel 1041.

Figure 5:
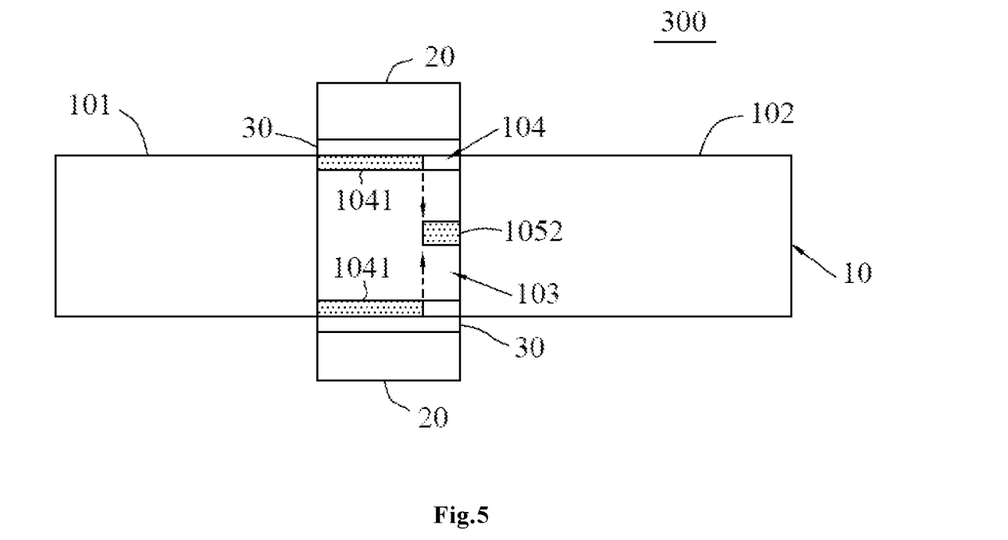

Referring to FIG. 5, another embodiment of a field effect transistor device 300 of the present invention is described.

Unlike the embodiments described above, in this embodiment no equivalent source 1051 is formed in the channel region 103 at this time when the device is turned on. The field effect transistor device 300 connects the source region 101 and the drain region 102 through the effective channel 1041 and the equivalent drain 1052 to contribute an operating current.

In the present embodiment, it is equivalent to that the effect of the drain potential on the effective channel 1041 is reduced by the provision of the equivalent drain 1052 alone, thereby improving the short-channel effect of the device. Correspondingly, the effective channel 1041 is directly connected to the source region 101.

In carrier transportation, the carrier provided by the source region 101 enters the effective channel 1041 and can be injected into the equivalent drain 1052 from one end of the effective channel 1041 away from the source region 101 and is re-injected back into the drain region 102. That is, in this embodiment, only the effective channel 1041 injects carriers unidirectionally into the conductive region.

In the above-described embodiment, a structure in which a portion of the channel 104 formed by the control of the gate 20 constitutes the effective channel 1041 has been shown. In such a structure, to further improve the short-channel effect of the device, it may be provided that the effective channel 1041 in the channel 104 has a conductance per unit length larger than that of the rest portion 1042 of the channel 104 other than the effective channel 1041. Some corresponding embodiments are described below.

Figure 6:
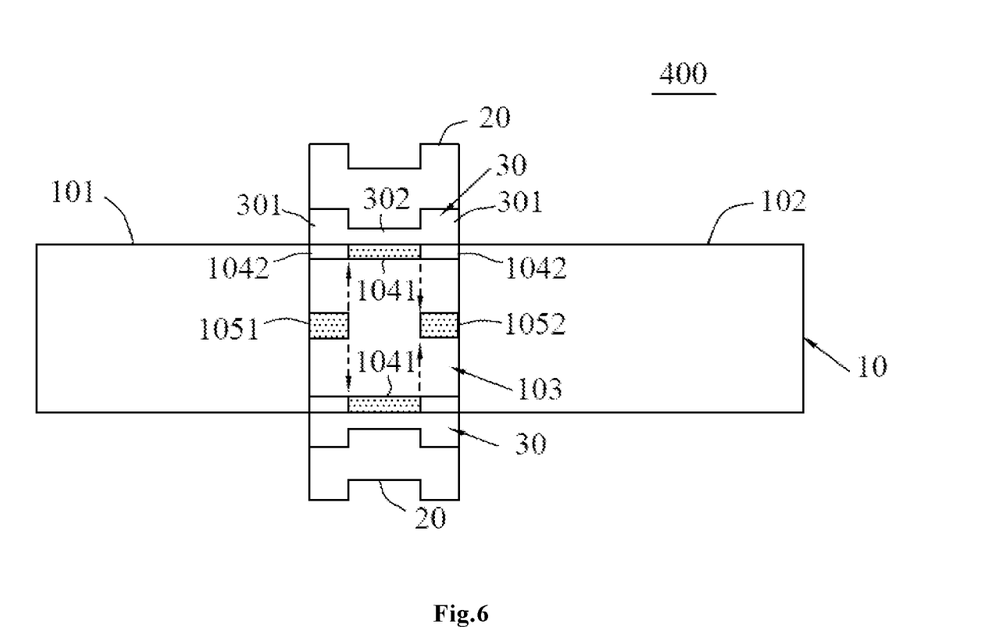

Referring to FIG. 6, another embodiment of a field effect transistor device 400 of the present invention is described. The field effect transistor device 400 comprises an active layer 10 comprising a source region 101, a drain region 102, and a channel region 103. The source region 101 and the drain region 102 are respectively located on two sides of the active layer 10, and the channel region 103 is located between the source region 101 and the drain region 102.

A gate 20 is arranged around the channel region 103, and a gate insulating layer 30 is arranged between the gate 20 and the channel region 103. The thickness of the portion 302 of the gate insulating layer 30 corresponding to the effective channel 1041 is less than the thickness of the rest portion 301. That is, the gate insulating layers of the corresponding portions of the equivalent source 1051 and the equivalent drain 1052 are relatively thickened, so that the modulation capability of the corresponding gate 20 of the rest portion channel 1042 beyond the effective channel 1041 to the corresponding portion channel 1042 can be reduced, thereby reducing the conductance per unit length of the corresponding portion channel 1042.

Cooperatively, it is also possible to adjust the material (dielectric constant) of the gate insulating layer of the portion of the gate insulating layer 30 corresponding to the effective channel 1041 to be different from that of the rest portion so that the conductance per unit length of the effective channel 1041 in the channel is larger than that of the rest portion.

Figure 7:
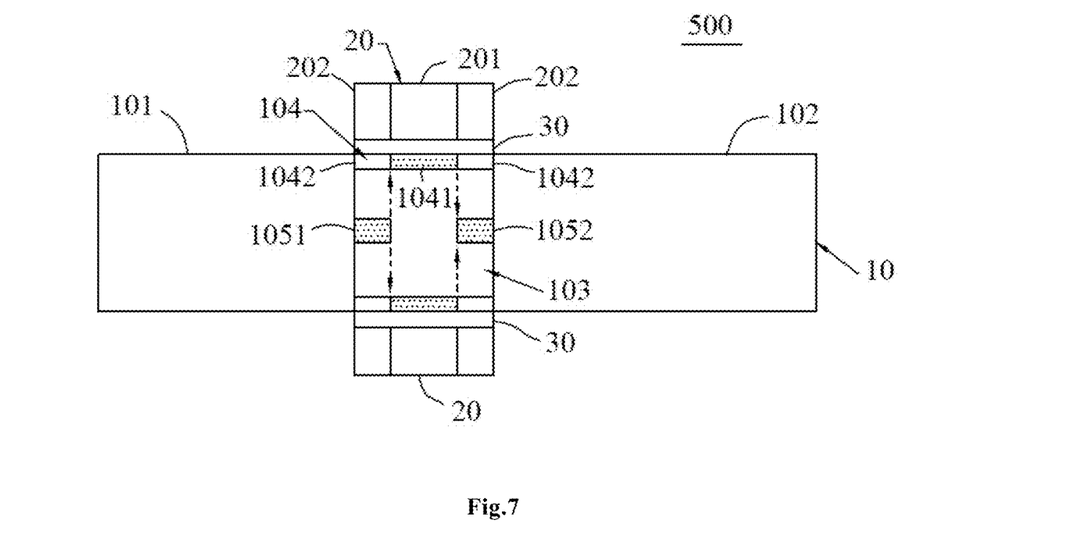

Referring to FIG. 7, another embodiment of a field effect transistor device 500 of the present invention is described. The field effect transistor device 500 comprises an active layer 10 comprising a source region 101, a drain region 102, and a channel region 103. The source region 101 and the drain region 102 are respectively located on two sides of the active layer 10, and the channel region 103 is located between the source region 101 and the drain region 102.

A gate 20 is arranged around the channel region 103, and a gate insulating layer 30 is arranged between the gate 20 and the channel region 103. The portion 201 of the gate 20 corresponding to the effective channel 1041 and the rest portion 202 are made of different materials, so that the portion 201 of the gate 20 corresponding to the effective channel 1041 and the rest portion 202 have different modulation capabilities for the channel formed correspondingly, and the conductance per unit length of the effective channel 1041 is realized to be larger than the conductance per unit length of the rest portion 1042 in the channel 104 except for the effective channel 1041.

Specifically, in the case of an N-type device, a metal with a small work function, such as aluminum, hafnium, titanium, or N-type doped (n+) polysilicon, or Ru—Hf, WN, HfN, TiN, TaN, TaSiN, etc. with a small work function obtained by adjusting the composition of the compound, can be used as a gate material for the portion 201 corresponding to the effective channel 1041 in the gate 20; the rest portion 202 may use a large work function metal such as gold, platinum, or P-type doped (P+) polysilicon, or ITO, RuO2, WN, MoN, and the like with a large work function obtained by adjusting the composition of the compound as the material of the gate 20. If it is a P-type device, a metal with a large work function, such as gold, platinum, or P-type doped (P+) polysilicon, or ITO, RuO2, WN, MoN, etc. with a large work function obtained by adjusting the composition of the compound can be used as the gate material for the portion 201 corresponding to the effective channel 1041 in the gate 20; the rest portion 202 may use a metal with a small work function such as aluminum, hafnium, titanium, or N-type doped (n+) polysilicon, or Ru—Hf, WN, HfN, TiN, TaN, TaSiN, etc. with a small work function obtained by adjusting the composition of the compound as the gate material.

Figure 8:
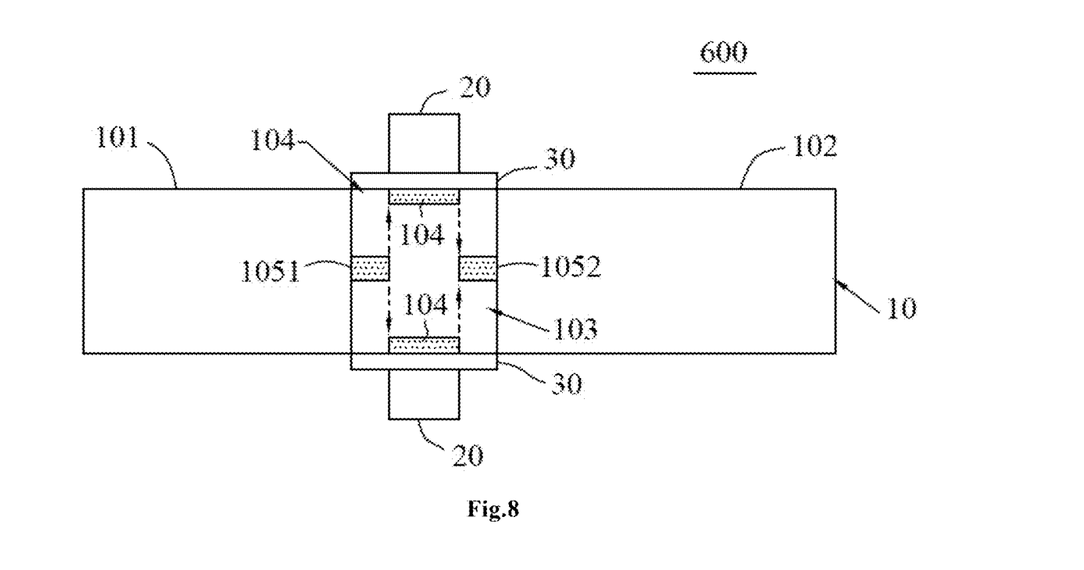

Referring to FIG. 8, in some alternative embodiments, the field effect transistor device 600 may also be provided with a surrounding gate 20 only on the surface of a portion of the channel region 103 between the equivalent source 1051 and the equivalent drain 1052. The gate 20 as a whole is not connected to at least one of the equivalent source 1051 and the equivalent drain 1052. At that, a channel structurally connecting the source region 101 and the drain region 102 will not be formed below the gate 20 even when a bias is applied to the gate 20 to turn the device on (as shown in FIG. 8, the channel 104 formed by the control of the gate 20 now does not connect the source region 101 and the drain region 102). That is, the channel 104 formed by the control of the gate 20 in the channel region 103 is entirely referred to as the "effective channel" described above.

Figure 9:
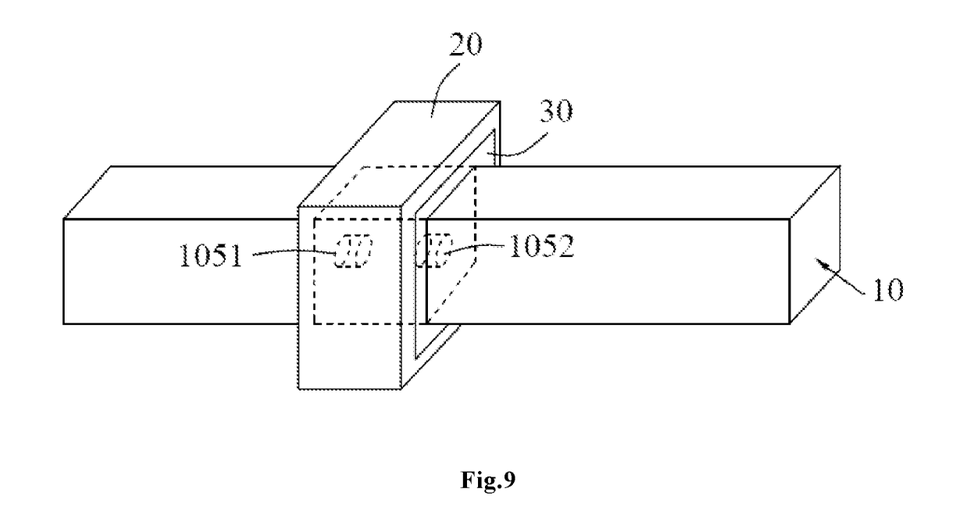

In the above embodiments, the mainly illustrated active layers are cylindrical and may also be referred to as "nanowire". The cross-sectional shape of such nanowires can be set differently as desired, such as a square cross-sectional nanowire (active layer 10) as illustrated in FIG. 9. Besides, in some alternative embodiments, the active layer may also be configured as a nanosheet or nanoring, and an equivalent source, an equivalent drain, and an effective channel are similarly provided in the channel region of the nanosheet or nanoring active layer to perform similar functions as described above, and will not be described in detail herein.

At the same time, in the field effect transistor device of the above-mentioned embodiments, the gates are all provided to surround and completely wrap the channel region; while in some other embodiments, the gate may not completely wrap the channel region, one typical embodiment being a Fin field effect transistor (FinFET).

In a fin field effect transistor, the gate surrounds the channel region on three sides, and the equivalent source and the equivalent drain may be provided further away from the top surface portion gate, thereby reducing the effect of the source potential and the drain potential on the effective channel.

The manner in which the conductive region is formed in the present invention is described below by some specific embodiments.

Embodiment 1

A conductive region A is formed by a carrier introduced by local doping in channel region 103A.

Figure 10:
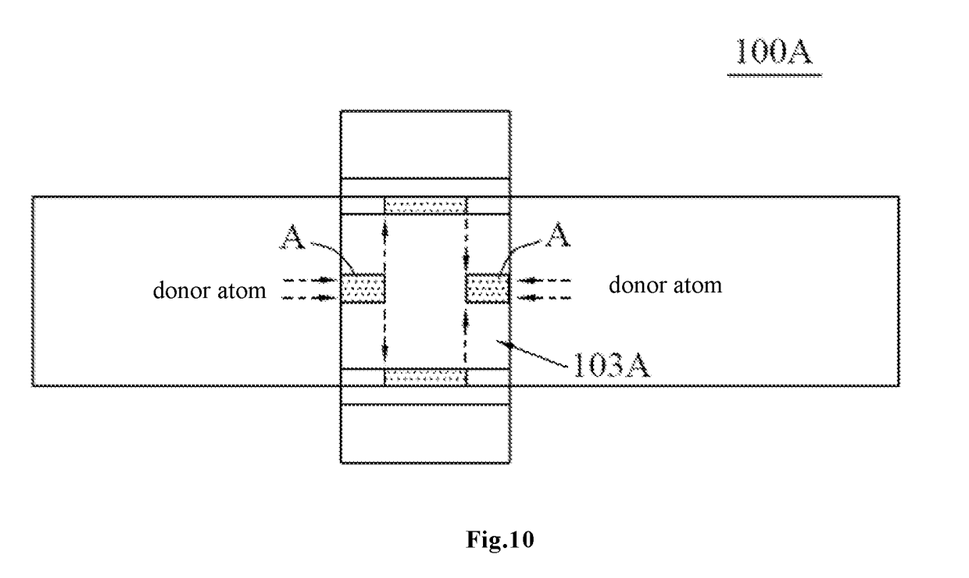
FIGS. 10-14 are schematic views of the fabrication methods of a conductive region in various embodiments of the present invention.
Figure 11:
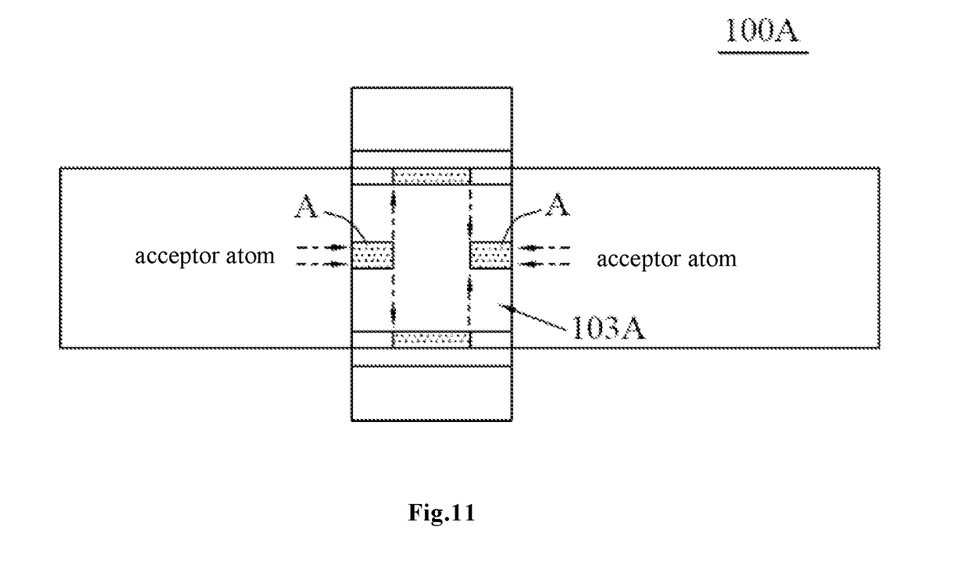

Accordingly, referring to FIG. 10, in the case of an N-type silicon-based device 100A, the doping concentration of a corresponding portion in the channel region 103A may be changed by doping a donor atom, such as phosphorus, arsenic, etc. in the channel region 103A; referring to FIG. 11, in the case of a P-type silicon-based device 100A, the doping concentration of the corresponding portion in the channel region 103A may be changed by doping an acceptor atom in the channel region 103A, such as boron.

Embodiment 2

Figure 12:
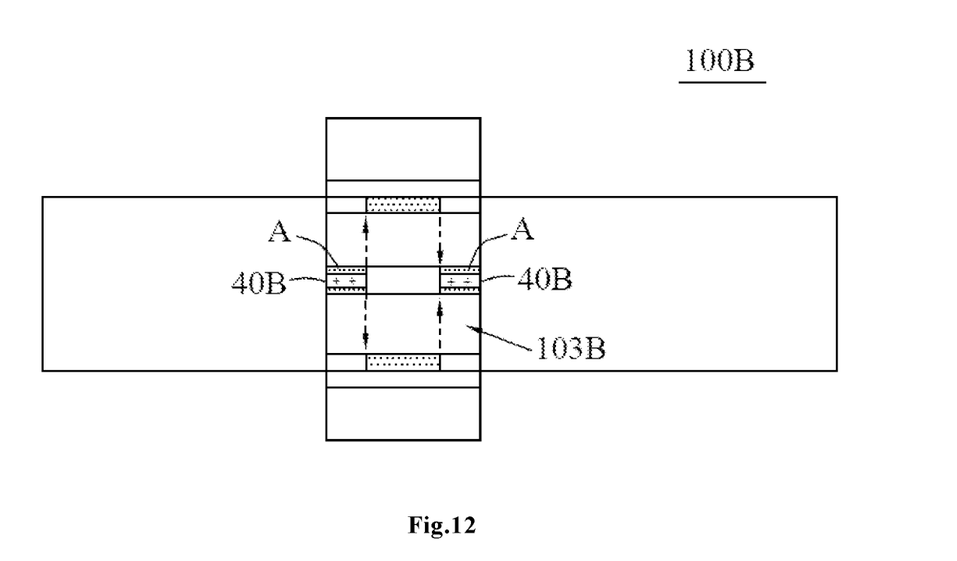
Figure 13:
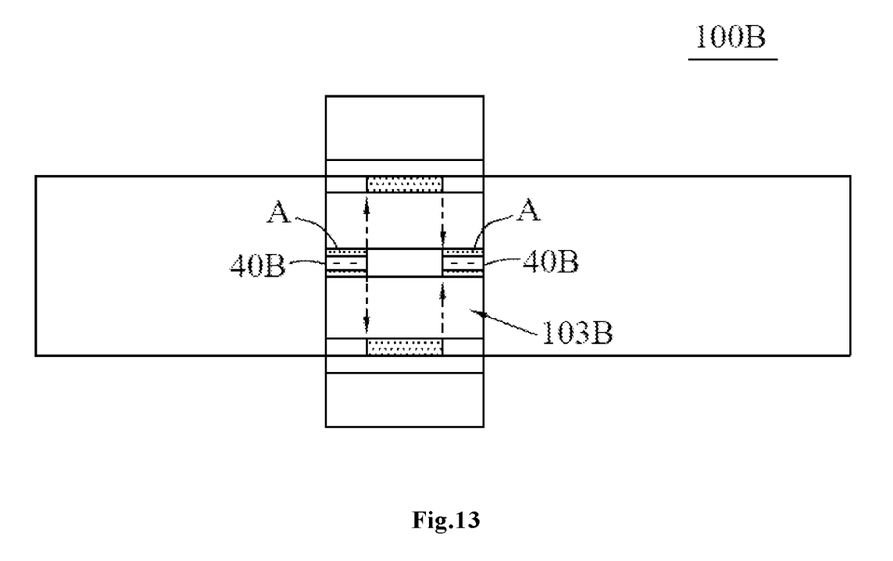

Referring to FIGS. 12 and 13, a field effect transistor device 100B further includes an insulating structure 40B provided in a channel region 103B, and a conductive region A is formed in a channel region 103B by electrostatic induction by introduced charges into the insulating structure 40B.

Correspondingly, referring to FIG. 12, in the case of an N-type device, this can be achieved by introducing positive charges, e.g. H+, holes, into the insulating structure 40B; referring to FIG. 13, in the case of a P-type device, this may be achieved by introducing negative charges, such as F−, Cl−, electrons, etc. into the insulating structure 40B. In this manner, a high density of fixed charges is formed in the insulating structure 40B, and carriers of the conductive region A are induced in the channel region 103B by electrostatic induction.

In a particular charge introduction process, the charge is preferably introduced into the insulating structure 40B at a location more proximate to the channel region 103B to enable the conductive region A formed in the channel region 103B to store more carriers. Of course, in some other alternative embodiments, a "sleeve-shaped" double-layer insulating structure may also be used, in particular comprising an outer-layer charge-trapping layer, and a conventional insulating structure in an inner layer of the charge-trapping layer. The charge-trapping layer may be made of a material that is easier to store charges, or nanoparticles of a metal or semiconductor may be incorporated therein to more stably store charges, thereby ensuring stable and controllable carriers in the conductive region.

Embodiment 3

Figure 14:
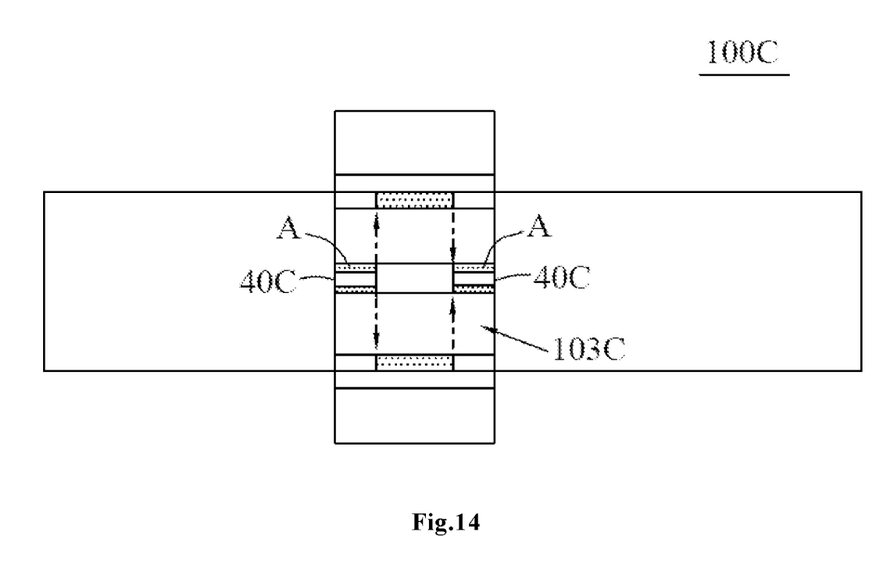

Referring to FIG. 14, a field effect transistor device 100C includes a semiconductor structure 40C provided in a channel region 103C, the semiconductor structure 40C and the channel region 103C constituting a heterostructure, and a conductive region A is formed of a two-dimensional electron gas channel or a two-dimensional hole gas channel distributed in the heterostructure.

Specifically, the semiconductor structure 40C and the channel region 103C have different band gaps, and the semiconductor structure 40C can be divided into two portions connected to the source region 101C and the drain region 102C, respectively, so that the formed two-dimensional electron gas channel does not conduct the source and drain regions.

Of course, in some alternative embodiments, a two-dimensional electron gas channel or a two-dimensional hole gas channel may also be formed, such as by processing a corresponding portion in the channel region 103C. Such alternative embodiments of forming the two-dimensional electron gas channel or the two-dimensional hole gas channel known to those skilled in the art are intended to be within the scope of the present invention. Also, the semiconductor structure 40C herein may be a barrier layer structure that may be doped or intrinsic.

In each of the above-described embodiments/embodiments, the active layer of the device may be formed of a single semiconductor material, or may include at least two kinds of semiconductor materials that change along the axial direction or the radial direction to form a composite channel so as to enhance carrier injection between the equivalent source, the equivalent drain, and the effective channel, and/or to reduce the effect of the drain potential on the effective channel to further improve the short-channel effect of the device.

It needs to be noted that reference herein to different semiconductor materials may be semiconductor materials in which the elemental component ratios are different. Taking the semiconductor material $Si_xGe_{1-x}$ as an example, when the values of x therein are different, it can be considered that the semiconductor materials are different.

In the following, taking the GAA device as an example, the transistor device of the present invention and the conventional (GAA) device are compared by simulation using Silvaco TCAD in terms of the device short-channel effect and device output curve characteristics.

The specific parameters of the device involved in the simulation are as follows:
① the material of the channel region is Si, it is a cylinder with a radius of 50 nm;
② the P-type doping concentration in the channel region is $10^{17}$ cm$^{-3}$;
③ the material of the gate insulating layer is $SiO_2$, and the thickness is 5 nm;
④ the conventional GAA device, the channel length L=0.1 μM;
⑤ according to the GAA device of the present invention, the apparent gate length $L_G$=0.2 μm;
⑥ according to the GAA device of the present invention, the effective channel length $L_{eff}$=0.1 μm;
⑦ according to the GAA device of the present invention, the lengths of the equivalent source and the equivalent drain are both 50 nm;
⑧ the N-type doping concentration in the source and drain regions is $2\times10^{19}$ cm$^{-3}$;
⑨ the fixed positive charge areal density at the channel back interface of the equivalent source drain formed by the GAA device of the present invention is $10^{14}$ cm$^{-2}$.

Figure 15:
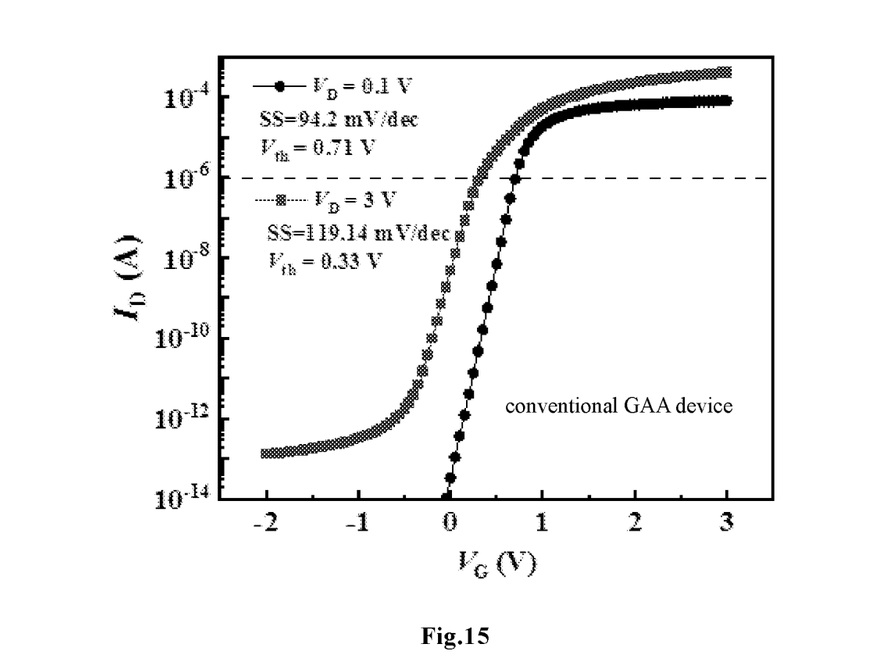
FIGS. 15 and 16 are diagrams comparing transfer curves of a GAA device using the field effect transistor device structure of the present invention and a conventional GAA device at different $V_D$ in an embodiment of the present invention.
Figure 16:
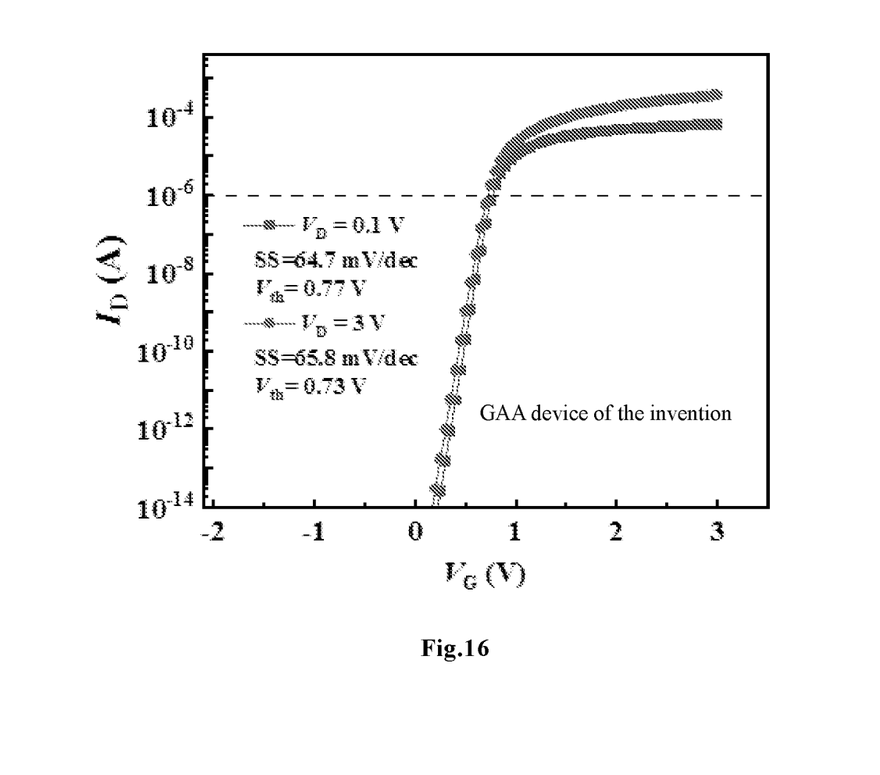

Referring to FIGS. 15 and 16, there are shown comparison diagrams of the transfer curves at different $V_D$s for the GAA device of the present invention and the conventional GAA device, respectively. It can be observed from the transfer curves at different VDs that the short-channel effect of the GAA device of the present invention is significantly improved compared to that of the conventional GAA device. When $V_D$=3V, the subthreshold swing SS for the conventional GAA device is 119.1 mV/dec, while the subthreshold swing for the GAA device of the present invention is 65.8 mV/dec. The threshold voltage of the conventional GAA device is significantly reduced when $V_D$=3V (when $V_D$=3 V, the threshold voltage is 0.33V, which is decreased by 0.38V compared to the threshold voltage of 0.71V when $V_D$=0.1V) due to the short-channel effect. In contrast, the change in the threshold voltage of the GAA device of the present invention is small (when $V_D$=3V, the threshold voltage is 0.73V, which is decreased by 0.04V compared to the threshold voltage of 0.77V when $V_D$=0.1V). As shown in the figure, the threshold voltage is extracted by using a constant current method.

Figure 17:
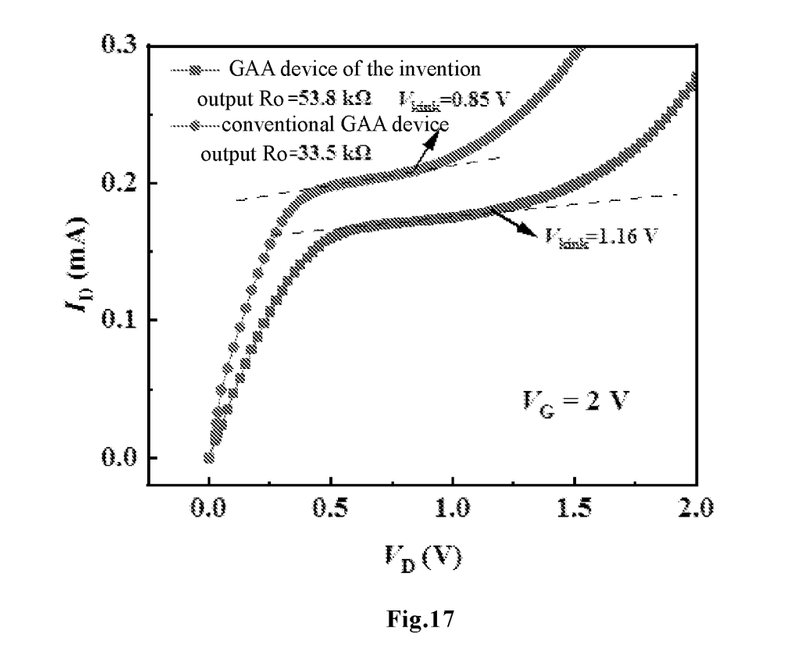
FIGS. 17 and 18 are diagrams comparing the output characteristics of a GAA device using the field effect transistor device structure of the present invention and a conventional GAA device in an embodiment of the present invention.
Figure 18:
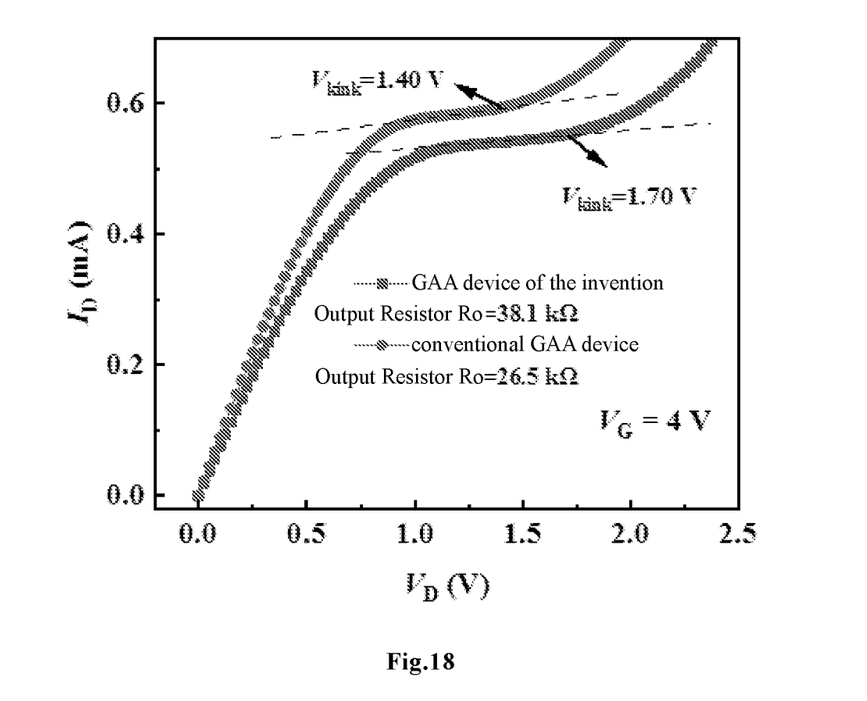

Referring to FIGS. 17 and 18, there are shown comparison diagrams of the output characteristics of the GAA device of the present invention and the conventional GAA device. It can be seen from the figure that the output characteristic curves of the GAA device of the present invention are flatter, the operating range is wider, and the output impedance is larger no matter $V_G$=2V or $V_G$=4V. The value of $V_D$ corresponding to the significant occurrence of kink current in the output characteristics is $V_{kink}$. The larger the $V_{kink}$ is, the weaker the carrier collision ionization effect in the device drain depletion region is, and the harder the device is to produce the kink current effect. Taking $V_G$=4V as an example (FIG. 18), the conventional GAA device has a $V_{kink}$=1.40V and the output impedance is 26.5kΩ, whereas the GAA device of the present invention has a $V_{kink}$ of 1.70V and an output impedance of 38.1 kΩ. It shows that the GAA device of the present invention can effectively reduce the collision ionization effect of carriers, suppress the kink current, improve the output resistor, and improve the output characteristics of the device when the device is operating.

Figure 19:
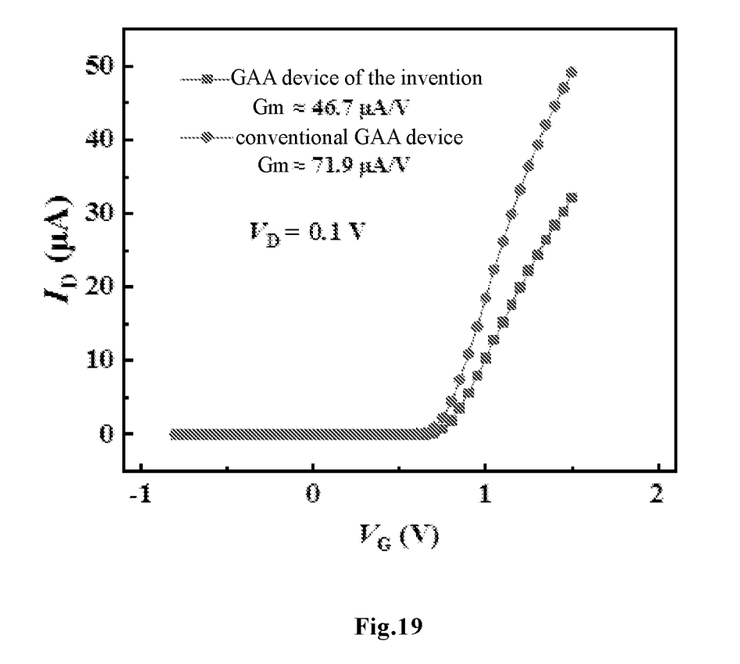
FIGS. 19 and 20 are diagrams comparing the transfer curves of a GAA device using the field effect transistor device structure of the present invention with a conventional GAA device in a linear region and a saturation region, respectively, in an embodiment of the present invention.
Figure 20:
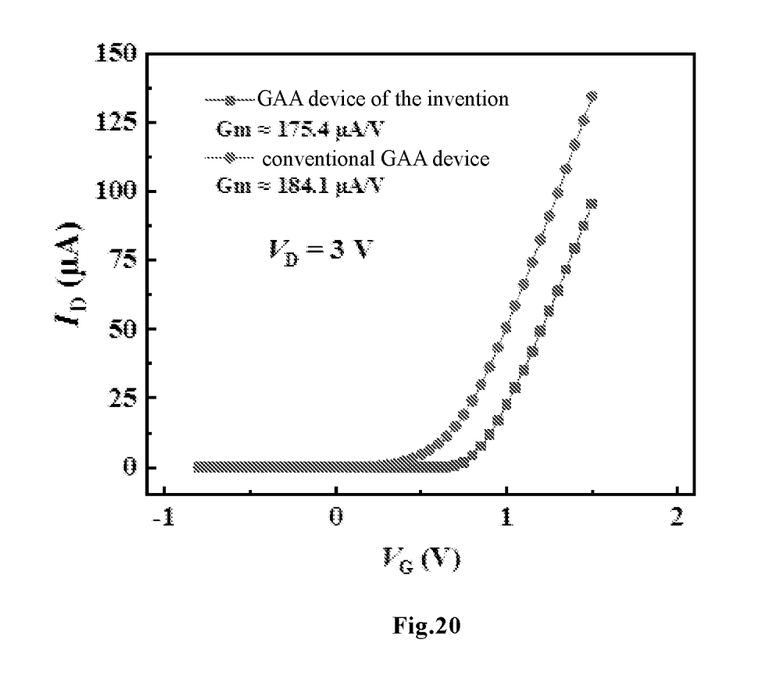

Referring to FIG. 19 and FIG. 20, there are shown comparison diagrams of the transfer curves of the GAA device of the present invention and the conventional GAA device in the linear region ($V_D$=0.1V) and the saturated region ($V_D$=3V), respectively. In the linear region, the on-state region transconductance of the GAA device of the present invention when $V_D=0.1V$ is 46.7 µA/V, which is reduced (about 35%) compared with 71.9 µA/V for the conventional GAA device. In the saturation region, the on-state region transconductance of the GAA device of the present invention when $V_D=3V$ is 175.4 µA/V, which is substantially the same (only reduced by about 4.7%) compared with 184.1 µA/V for the conventional GAA device. Therefore, the various embodiments/embodiments provided herein can effectively improve the short-channel effect of the device at a saturation region with a large $V_D$ almost without sacrificing the original conduction performance of the device.

It should be understood that the described embodiments of the present invention are for illustrative purposes only and are not intended to limit the scope of the invention. Those skilled in the art can make various other replacements, changes, and improvements within the scope of the invention. Therefore, the invention is not limited to the above embodiments, and is only defined by the claims.

What is claimed is:

1. A field effect transistor device, comprising:
   an active layer including a source region, a drain region, and a channel region located between the source region and the drain region;
   a gate provided around the channel region; and
   a gate insulating layer provided between the gate and the channel region;
   wherein an effective channel, as well as an equivalent source and/or equivalent drain spaced away from the effective channel are formed in the channel region upon turning on of the field effect transistor device,
   when the effective channel and the equivalent source are formed in the channel region, the source region is connected with the drain region through the equivalent source and the effective channel, so as to form an operating current;
   when the effective channel and the equivalent drain are formed in the channel region, the source region is connected with the drain region through the effective channel and the equivalent drain, so as to form an operating current; and
   when the effective channel, the equivalent source and the equivalent drain are formed in the channel region, the source region is connected with the drain region through the equivalent source, effective channel and the effective drain, so as to form an operating current;
   wherein a conductive region that does not connect the source region and the drain region is formed in the channel region;
   when the conductive region is in connection with the source region, the conductive region constitutes the equivalent source; and when the conductive region is in connection with the drain region, the conductive region constitutes the equivalent drain;
   wherein perpendicular projections of the gate and the conductive region on a reference plane overlap, the gate is capable of controlling the channel region and form a channel therein, and portions of perpendicular projections of the gate and the conductive region on the reference plane that are not overlapping each other constitute the effective channel, wherein the reference plane is a plane passing through a central axis along a length direction of the channel region; and
   wherein when the device is turned on, a conductance of the conductive region is greater than that of the rest portion of the channel other than the effective channel so that at least one of the conductive region and the effective channel can inject carriers into the other.

2. The field effect transistor device of claim 1, wherein the conductance of the conductive region is at least greater than three times of the conductance of the rest portion of the channel other than the effective channel when the device is turned on.

3. The field effect transistor device of claim 1, wherein a conductance per unit length of the effective channel in the channel is greater than the conductance per unit length of a rest portion of the channel other than the effective channel when the device is turned on.

4. The field effect transistor device of claim 3, wherein the conductance per unit length of the effective channel in the channel is at least greater than three times of the conductance per unit length of a rest portion of the channels other than the effective channel when the device is turned on.

5. The field effect transistor device of claim 3, wherein a thickness of a portion of the gate insulating layer corresponding to the effective channel is less than the thickness of the rest portion of the gate insulating layer.

6. The field effect transistor device of claim 3, wherein a portion of the gate insulating layer corresponding to the effective channel and the rest portion of the gate insulating layer are made of materials with different dielectric constants.

7. The field effect transistor device of claim 3, wherein a portion of the gate corresponding to the effective channel and the rest portion are made of materials having different work functions.

8. The field effect transistor device of claim 1, wherein the equivalent source and/or equivalent drain extend along a central axis along a length direction of the channel region.

9. The field effect transistor device of claim 1, wherein the conductive region is formed by a layer of carriers introduced by doping in the channel region.

10. The field effect transistor device of claim 1, wherein the active layer comprises at least two semiconductor materials that change along an axial direction or a radial direction of the active layer.

11. The field effect transistor device of claim 1, wherein an insulating structure is provided in the channel region, wherein the conductive region is formed by a layer of carriers induced in the channel region approximate to the insulating structure, said carriers being induced through electrostatic induction by electric charges introduced into the insulating structure.

12. The field effect transistor device of claim 1, wherein a semiconductor structure is provided in the channel region, the semiconductor structure and the channel region form a heterostructure, and the conductive region is composed of a two-dimensional electron gas channel or a two-dimensional hole gas channel formed in the heterostructure.

13. The field effect transistor device of claim 1, wherein the active layer is configured as a nanowire, nanosheet, or nanoring.

* * * * *